United States Patent [19]

Edmonds et al.

[11] 4,364,100

[45] Dec. 14, 1982

[54] MULTI-LAYERED METALLIZED SILICON MATRIX SUBSTRATE

[75] Inventors: Harold D. Edmonds, Hopewell Junction; Gary Markovits, Poughkeepsie, both of N.Y.

[73] Assignee: International Business Machines Corporation, Armonk, N.Y.

[21] Appl. No.: 143,216

[22] Filed: Apr. 24, 1980

[51] Int. Cl.$^3$ .............................................. H05K 1/03
[52] U.S. Cl. ..................................... 361/395; 156/89; 156/57; 174/68.5; 428/428; 501/154
[58] Field of Search ...................... 361/320, 321, 395; 174/68.5; 156/89, 657; 501/154; 428/428

[56] References Cited

U.S. PATENT DOCUMENTS

| | | | |
|---|---|---|---|
| 3,180,742 | 4/1965 | Bennett | 156/89 X |
| 3,461,524 | 8/1969 | Lepselter | 174/68.5 |
| 3,628,778 | 8/1966 | Worsham | 174/68.5 |
| 3,637,425 | 1/1972 | McMillan | 428/428 |
| 3,996,885 | 6/1976 | May | 156/89 X |
| 4,040,849 | 8/1977 | Greskovich | 106/73.5 |
| 4,168,343 | 9/1979 | Arai | 428/428 X |
| 4,261,781 | 4/1981 | Edmonds | 156/254 |

*Primary Examiner*—R. R. Kucia
*Attorney, Agent, or Firm*—Wolmar J. Stoffel

[57] ABSTRACT

A multi-layer metallized substrate comprises a matrix of sintered silicon particles joined by a thin insulating layer of silicon dioxide or silicon nitride. Semiconductor circuit chips are bonded to the surface of the substrate to form an electrically connected, unitary integrated circuit module structure.

5 Claims, 4 Drawing Figures

MULTI-LAYERED METALLIZED SILICON MATRIX SUBSTRATE

DESCRIPTION

Field of the Invention

This invention relates generally to integrated circuit modules and more specifically to a substrate structure, formed of a silicon matrix, for mounting integrated circuit chips.

Background of the Invention

Multi-layer metallized ceramic substrates are used to mount integrated circuit chips and provide integrated circuit interconnections. These substrates are formed from a number of individual ceramic green sheets which are metallized, stacked, laminated and fired to form a monolithic ceramic-metal package. These general processes are known in the art and are described in the article entitled "A Fabrication Technique for Multi-Layer Ceramic Modules", H. D. Kaiser et al., Solid State Technology, May 1972, pages 35–40. The substrates include metal pads on one surface for mounting and electrically connecting the integrated circuit chips through solder ball connections and metal pins on the other surface to mount and electrically connect the integrated circuit modules to circuit boards.

One requirement associated with such modules involves the heat generated during use which must be removed to maintain the circuit components within certain critical operating temperature ranges. Also, the thermal cycling which occurs during use provides stress on the chip connections due to differences in the thermal expansion coefficients of the materials of the chip and substrate. Ways of improving thermal expansion capabilities are sought in order to decrease the occurrence of interconnection failures due to thermal cycling. The use of a slurry of silicon powder in a binder in forming backing layers for compound semiconductor wafers has been described by Edmonds, Markovits and Lyons in U.S. Pat. No. 4,261,781, issued Apr. 4, 1981.

SUMMARY OF THE INVENTION

In accordance with this invention there is provided a substrate comprising a matrix of sintered silicon particles joined by an insulating layer of a silicon compound such as silicon dioxide or silicon nitride with conductor lines formed therein and having electrical connection pads on a surface thereof.

Also provided is an integrated circuit module comprising a silicon semiconductor integrated circuit chip having electrical conductors at a surface thereof, and a multi-layer laminated substrate comprising a matrix of sintered silicon particles joined by a layer of a silicon compound such as silicon dioxide or silicon nitride with conductor lines formed therein and having electrical connection pads at a surface thereof, said electrical conductors and said pads being bonded together to form an electrically connected unitary structure.

For the best heat conductivity, the surfaces of the chip and substrate are bonded together in face-to-face relationship.

DETAILED DESCRIPTION

Figure 1:
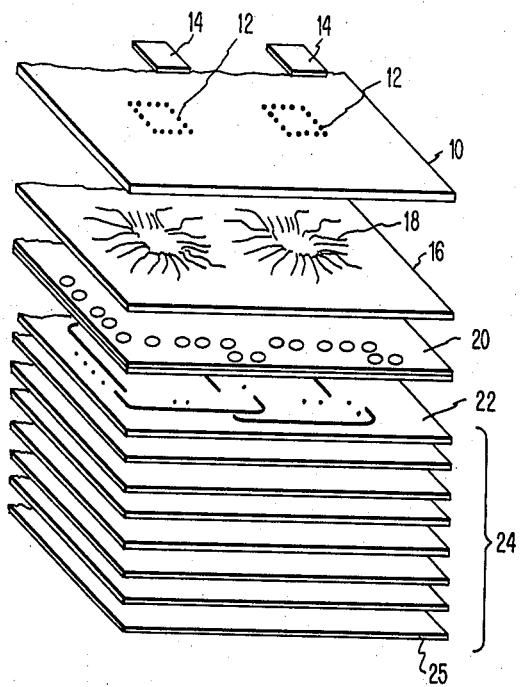
FIG. 1 illustrates an expanded stack of polycrystalline silicon layers having metallization patterns in a multi-layer structure and two integrated circuit chips.

Polysilicon green sheets are prepared by weighing out the proper portion of silicon and grinding and blending the silicon by ball or other mixing technique with an organic binder to form a slurry. The organic binder comprises a thermoplastic polymer portion, a plasticizer portion and solvents. The slurry is cast into sheet or tape form by any suitable technique such as extruding or doctor blading. The cast sheet is then dried by allowing the solvent to evaporate. After the sheet is completely dried, it is cut into working blanks or sheets and registration and via holes are punched in the blanks. The via holes are filled with a conductive composition to form electrical connections between layers. The conductive composition is also screened onto the surface of some sheets to form circuits.

A suitable slurry can be prepared, for example, as follows:

Binder:
    695 grams of methyl isobutyl ketone
    230 grams of methanol
    38 grams of Benzaflex* dipropylene glycol dibenzoid powder
    34 grams of Butvar B-98** polyvinyl butyral powder (plasticizer)

\* Velsicol Corp.
\*\* Monsanto Corp.

The binder is mixed with silicon, which can be scrap silicon from broken wafers or the ends of crystals, in about equal portions, for example, 200 grams of binder to 200 grams of silicon, in a medium size ball mill for six hours using $Al_2O_3$ balls and a speed of 65 r.p.m. After six hours the mill is opened and an additional 20 grams of B-98 powder plasticizer is added and the mixture milled for 4 more hours. The slurry is placed in a bell jar and a vacuum is applied to remove trapped air from the slurry. The silicon particle size is less than about 5 microns and most of the particles have a size range of about 1–3 microns.

The slurry is cast by a doctor blade onto the surface of a plastic sheet, dried, cut and punched as described above.

Conductive compositions for filling the via holes and forming circuit patterns are prepared in the form of a paste as is known in the art. Typical pastes include a refractory or noble metal or metal oixde powder such as described, for example in U.S. Pat. No. 3,093,490 to R. J. Mackey and U.S. Pat. No. 4,109,377 to Blazik and Miller, whose teachings are incorporated by reference. Metallizing compositions which are useful include, for example, molybdenum, tungsten, silver and palladium.

The metal or a mixture of metal and metal oxide powder is mixed, such as by milling, with a suitable vehicle or solvent to form a screenable paste. The vehicle is chosen such that it can be removed at or below the sintering temperature of the silicon powder so that only the residual metallization remains after the process is completed. The conductive paste is screened onto the green sheets to form the desired circuit patterns by conventional silk screening techniques. Where electrical connections between layers are to be formed, the punched via holes in the sheets are also filled by a screening operation either at the same time as the circuit patterns are formed or in a separate screening operation. The paste is dried such as by placing the sheets in an oven and baking them at a rather low temperature, for example, 60°–100° C. for 15–60 minutes. The paste may also be simply air dried.

FIG. 1 is an exploded view illustrating a plurality of silicon green sheets having a variety of conductive patterns thereon which are stacked in the proper sequence. The stack can be registered using registration pins which fit into the registration holes which have been formed in each sheet. The top sheet 10 is provided with two metal patterns 12 which are suitable for joining semiconductor chips 14 thereto. Because of the thermal compatibility of the substrate and chip materials, one advantage of the invention is that the chips can be joined in face-to-face relationship to top sheet 10 through a silicon dioxide layer. This seals the chip circuitry and interconnection metallurgy and heat transfer away from the chips is enhanced during operation. The next sheet 16 has two conductive patterns 18 which connect through conductive via holes through layer 10 to patterns 12. Via holes through sheet 18 make circuit connection to the succeeding sheets 20, 22 and the remaining group of sheets 24 so as to provide the required circuit connections for the input and output of electrical signals to and from the semiconductor chips 14. Pins (not shown) are inserted into or braised onto the outer surface of the last sheet 25 in order to provide electrical connection of the chip and substrate module to outside circuitry.

Figure 2:
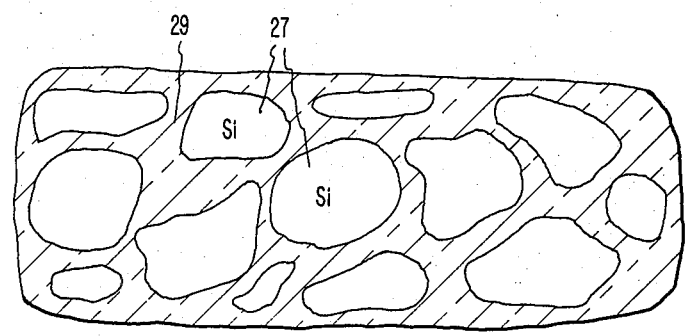
FIG. 2 is a cross-sectional view of the matrix of silicon particles in the insulating layer.
Figure 3:
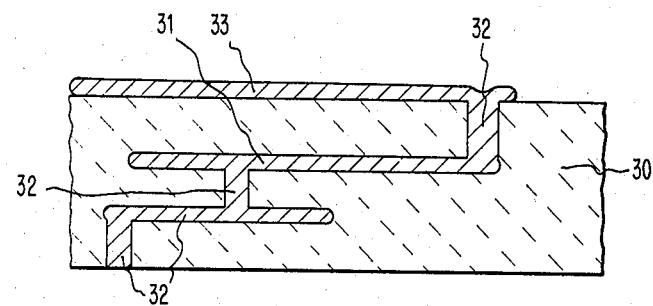
FIG. 3 is a cross-sectional view illustrating metal lines and interconnections in the substrate after firing.

The registered stack of silicon green sheets is placed in a laminating press where moderate heat and pressure is applied to cause the thermoplastic binder to soften and fuse the layers. The stack of green sheets is then sawed or punched to the size of the desired finished substrate plus an allowance for shrinkage. The green module is fired in a furnace. The firing temperature will effect the thermal expansion coefficient of the substrate with a firing temperature of about 1400° C. for two hours producing a thermal expansion coefficient of about $4.1 \times 10^{-6}$ °K$^{-1}$ compared with about $4.2 \times 10^{-6}$ °K$^{-1}$ for a monocrystalline silicon chip. Firing at a temperature of 1200° C. gave an expansion coefficient of about $2.5 \times 10^{-6}$ °K$^{-1}$ and at 1300° C. about $2.7-3.0 \times 10^{-6}$ °K$^{-1}$. A firing time of 8 hours did not significantly change the expansion coefficients. The firing atmosphere is chosen to avoid attack on the particular metallurgy which is present with atmospheres of $O_2$, $N_2$ or mixtures of these gases with a noble gas such as argon being satisfactory. The result is a substrate formed of a matrix of silicon particles joined by a common insulating layer of an inorganic silicon compound. This structure is schematically shown in cross-section in FIG. 2. The silicon particles 27 having a size range of about 1–5 microns are joined by a common insulating layer region 29 of silicon dioxide, silicon nitride, or a mixture thereof, depending upon the firing atmosphere. The insulating layer has a thickness of from about 1000 to 10,000 Ångstroms (0.1 to 1.0 micron). For the purposes of illustration the relative size of the particles and the continuous insulating layer region 29 are not shown to scale in FIG. 2 with the volume of region 29 being actually much smaller with respect to the volume of particles 27 than is shown. After firing, conductor lines 31, interconnections 32 and connecting pad 33 are formed with substrate 30 into an integral structure as illustrated in FIG. 3.

The structure, because of the insulating layer surrounding the silicon particles, has a calculated dielectric constant range of about 5 to 7 which is suitable to provide insulation between the conductors which would not be the case with a structure of pure silicon. The structure also has a high thermal conductivity of about 0.2 Cal S$^{-1}$CM$^{-1}$/°K$^{-1}$ compared to the conductivity of conventionally used alumina substrates of about 0.052 Cal S$^{-1}$Cm$^{-1}$ °K$^{-1}$. This provides a significant advantage with respect to cooling integrated the circuit chips mounted on the silicon matrix substrate.

Figure 4:
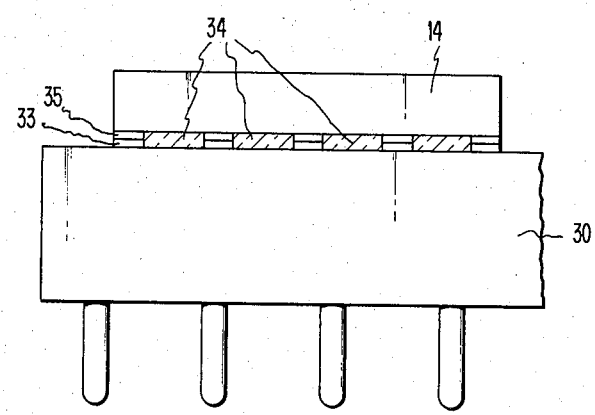
FIG. 4 illustrates a multi-layer substrate with an integrated circuit chip bonded thereto in face-to-face relationship.

In order to take maximum advantage of the thermal, heat conducting properties of the silicon matrix substrates, the integrated circuit chip 14 is joined in face-to-face relationship with substrate 30 (FIG. 4) through an oxide layer 34 with the connecting pads 33 of pattern 12 (FIG. 1) positioned to make contact with corresponding pads 35 on chip 14.

The joining process is accomplished by placing the chip 14 in contact with substrate 30 so that the corresponding connecting pads are aligned and the solder reflowed via an infrared heating technique. The oxide is then grown by a low temperature 300° C. plasma oxidation. It should be understood that the solder reflow temperature is in the range of 400° C. so that no further solder flow occurs during plasma oxidation.

While our invention has been particularly shown and described with reference to the preferred embodiments thereof, it will be understood by those skilled in the art that various changes in form and details may be made therein without departing from the spirit and scope of the invention.

We claim:

1. A substrate having a coefficient of expansion in the range of $2.5 \times 10^{-6}$ to $4.1 \times 10^{-6}$ °K$^{-1}$ comprising
    a matrix of sintered silicon particles of a size less than 5 microns, each particle joined and surrounded by an electrically insulating layer of a silicon compound selected from the group consisting of silicon dioxide, silicon nitride, and mixtures thereof, said insulating layer of a thickness in the range of 0.1 to 1 micron,
    said substrate including conductor lines formed therein, and having electrical connection pads on a surface thereof.

2. The substrate of claim 1 wherein the silicon particles have a size range of about 1 to 3 microns, and the substrate has a coefficient of expansion of about $4.1 \times 10^{-6}$ °K$^{-1}$, a thermal conductivity of about 0.2 Cal S$^{-1}$ Cm$^{-1}$°K$^{-1}$, and a dielectric constant range of about 5 to 7.

3. An integrated circuit module with at least one silicon semiconductor integrated circuit chip having electric conductors on a surface thereof, and a multilayer laminated substrate having a coefficient of expansion in the range of $2.5 \times 10^{-6}$ to $4.1 \times 10^{-6}$ °K$^{-1}$ comprising,
    a matrix of sintered silicon particles of a size less than 5 microns, each particle joined and surrounded by an insulating layer of a silicon compound selected from the group consisting of silicon dioxide, silicon nitride, and mixtures thereof, said insulating layer of a thickness in the range of 0.1 to 1 micron, said substrate having conductor lines formed therein and having electrical connection pads at a surface thereof, said electrical conductors and said pads being bonded together to form an electrically connected unitary structure.

4. The module of claim 3 wherein the silicon particles have a size range of about 1 to 3 microns, the substrate has a coefficient of expansion of about $4.1 \times 10^{-6} \, °K^{-1}$, a thermal conductivity of about $0.2 \, \text{Cal} \, S^{-1} \, Cm^{-1} °K^{-1}$, and a dielectric constant range of about 5 to 7.

5. The module of claim 3 wherein the surfaces of the chip and the substrate are bonded together in face-to-face relationship with an insulating layer.

* * * * *